US012772706B2

(12) United States Patent
Lee et al.

(10) Patent No.: US 12,772,706 B2
(45) Date of Patent: Oct. 20, 2026

(54) LIGHT EMITTING DISPLAY DEVICE

(71) Applicant: LG Display Co., Ltd., Seoul (KR)

(72) Inventors: In-Goo Lee, Paju-si (KR); Hyeon-Hye Yu, Paju-si (KR)

(73) Assignee: LG Display Co., Ltd., Seoul (KR)

(*) Notice: Subject to any disclaimer, the term of this patent is extended or adjusted under 35 U.S.C. 154(b) by 435 days.

(21) Appl. No.: 18/503,988

(22) Filed: Nov. 7, 2023

(65) Prior Publication Data

US 2024/0224744 A1 Jul. 4, 2024

(30) Foreign Application Priority Data

Dec. 29, 2022 (KR) ........................ 10-2022-0189144

(51) Int. Cl.
*H10K 59/80* (2023.01)
*H10K 59/122* (2023.01)
*H10K 59/35* (2023.01)

(52) U.S. Cl.
CPC ......... *H10K 59/878* (2023.02); *H10K 59/122* (2023.02); *H10K 59/35* (2023.02)

(58) Field of Classification Search
CPC .... H10K 59/878; H10K 59/122; H10K 59/35; H10K 50/856; H10K 59/124; H10K 59/121; H10K 59/80518; H10K 59/353; H10K 59/352; H10K 59/80515; H10K 59/8052
USPC ........................................................ 313/500
See application file for complete search history.

(56) References Cited

U.S. PATENT DOCUMENTS

2023/0276674 A1* 8/2023 Bok .................... H10K 59/352

* cited by examiner

*Primary Examiner* — James R Greece
*Assistant Examiner* — Hana S Featherly
(74) *Attorney, Agent, or Firm* — Seed Intellectual Property Law Group LLP

(57) ABSTRACT

A light emitting display device includes a bank that is on a substrate and includes an opening corresponding to each of a plurality of pixel regions of a display region. The display device includes an inclined reflective portion that is below the bank and disposed in each of the plurality of pixel regions. The display device includes a light emitting diode disposed in the opening. Each of the plurality of pixel regions is configured such that the corresponding opening and reflective portion have a cardioid-shaped structure with a cusp. The plurality of pixel regions include a pixel region in which the cardioid-shaped structure is located in a first azimuth, and a pixel region in which the cardioid-shaped structure is located in a second azimuth opposite to the first azimuth.

17 Claims, 6 Drawing Sheets

LIGHT EMITTING DISPLAY DEVICE

CROSS REFERENCE TO RELATED APPLICATIONS

The present application claims the priority benefit of Korean Patent Application No. 10-2022-0189144 filed in Republic of Korea on Dec. 29, 2022, which is hereby incorporated by reference in its entirety for all purposes as if fully set forth herein.

BACKGROUND

Technical Field

The present disclosure relates to a light emitting display device.

Description of the Related Art

Recently, flat panel display devices having excellent characteristics such as thinness, light weight, and low power consumption have been widely developed and applied to various fields.

Among the flat panel display devices, a light emitting display device including a light emitting element such as a light emitting diode is a display device in which charges are injected into a light emitting layer formed between an anode and a cathode to form pairs of electrons and holes, and then the pairs disappear to emit light.

BRIEF SUMMARY

The light emitting display device in the related art have a low light efficiency and thus the inventors of the present disclosure have provided various embodiments of a display device that has an improved light efficiency. That is, one of the technical benefits of the present disclosure includes providing a display device that can improve light efficiency.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, a light emitting display device includes: a bank that is on a substrate and includes an opening corresponding to each of a plurality of pixel regions of a display region; an inclined reflective portion that is below the bank and disposed in each of the plurality of pixel regions; and a light emitting diode disposed in the opening, wherein each of the plurality of pixel regions is configured such that the corresponding opening and reflective portion have a cardioid-shaped structure with a cusp, and wherein the plurality of pixel regions include a pixel region in which the cardioid-shaped structure is located in a first azimuth, and a pixel region in which the cardioid-shaped structure is located in a second azimuth opposite to the first azimuth.

In another aspect, a light emitting display device includes: a light emitting diode that is in each of a plurality of pixel regions arranged in a display region on a substrate, and includes an emission layer forming an interface of a cardioid-shaped structure with a side surface of a bank; and an inclined reflective portion that is below the bank and disposed outside the interface, wherein the plurality of pixel regions include a pixel region in which the cardioid-shaped structure is located in a first azimuth, and a pixel region in which the cardioid-shaped structure is located in a second azimuth opposite to the first azimuth.

In yet another aspect, a light emitting display device includes: an overcoat layer that is on a substrate and includes a concave groove corresponding to at least one pixel region; a first electrode including a reflective portion disposed along an inclined surface of the concave groove; a bank disposed on the first electrode and including an opening; and an organic emission layer and a second electrode disposed in the opening, wherein at least two of the concave groove, the reflective portion, and the opening are configured in a cardioid-shaped structure with a cusp.

It is to be understood that both the foregoing general description and the following detailed description are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1:
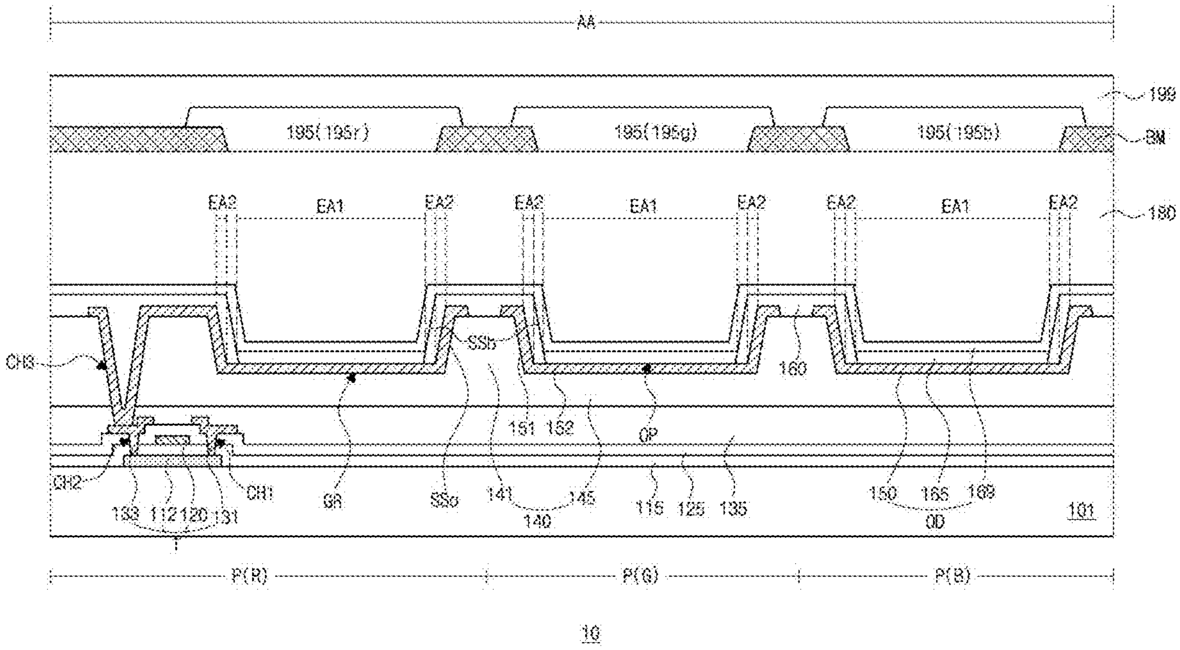
FIG. 1 is a schematic cross-sectional view illustrating a light emitting display device according to a first embodiment of the present disclosure.

Advantages and features of the present disclosure and methods of achieving them will be apparent with reference to the embodiments described below in detail with the accompanying drawings. However, the present disclosure is not limited to the embodiments disclosed below, but can be realized in a variety of different forms, and only these embodiments allow the present disclosure to be complete. The present disclosure is provided to fully inform the scope of the disclosure to the skilled in the art of the present disclosure.

The shapes, sizes, dimensions (e.g., length, width, height, thickness, radius, diameter, area, etc.), proportions, angles, numbers, number of elements, and the like disclosed in the drawings for explaining the embodiments of the present disclosure are illustrative, and the present disclosure is not limited to the illustrated matters. The same reference numerals refer to the same components throughout the description.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

Furthermore, in describing the present disclosure, if it is determined that a detailed description of the related known technology unnecessarily obscure the subject matter of the present disclosure, the detailed description thereof can be omitted. When 'comprising,' 'including,' 'having,' 'consisting,' and the like are used in this disclosure, other parts can be added unless 'only' is used. When a component is expressed in the singular, cases including the plural are included unless specific statement is described.

In interpreting the components, even if there is no separate explicit description, it is interpreted as including a margin range.

In the case of a description of a positional relationship, for example, when the positional relationship of two parts is described as 'on,' 'over,' 'above,' 'below,' 'beside,' 'under,' and the like, one or more other parts can be positioned between such two parts unless 'right' or 'directly' is used.

In the case of a description of a temporal relationship, for example, when a temporal precedence is described as 'after,' 'following,' 'before,' and the like, cases that are not continuous can be included unless 'directly' or 'immediately' is used.

In describing components of the present disclosure, terms such as first, second and the like can be used. These terms are only for distinguishing the components from other components, and an essence, order, order, or number of the components is not limited by the terms.

Respective features of various embodiments of the present disclosure can be partially or wholly connected to or combined with each other and can be technically interlocked and driven variously, and respective embodiments can be independently implemented from each other or can be implemented together with a related relationship.

Hereinafter, embodiments of the present disclosure are described in detail with reference to the drawings. Meanwhile, in the following embodiments, the same and like reference numerals are assigned to the same and like components, and detailed descriptions thereof may be omitted.

First Embodiment

Figure 2:
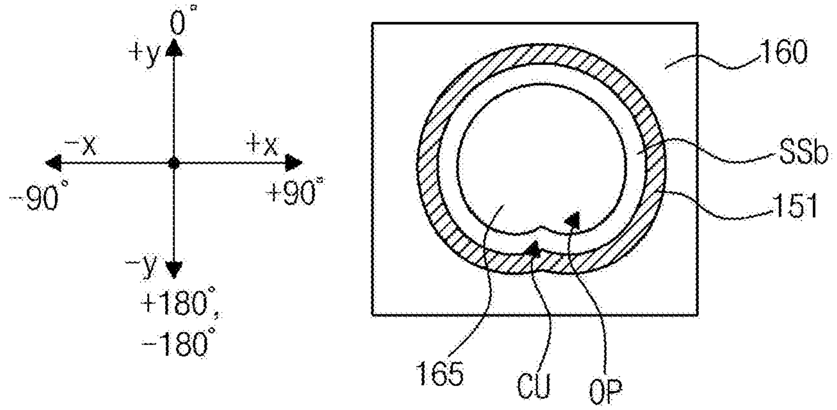
FIGS. 2 to 4 are plan views schematically illustrating a cardioid-shaped light extraction structure of a pixel region according to a first embodiment of the present disclosure.
Figure 3:
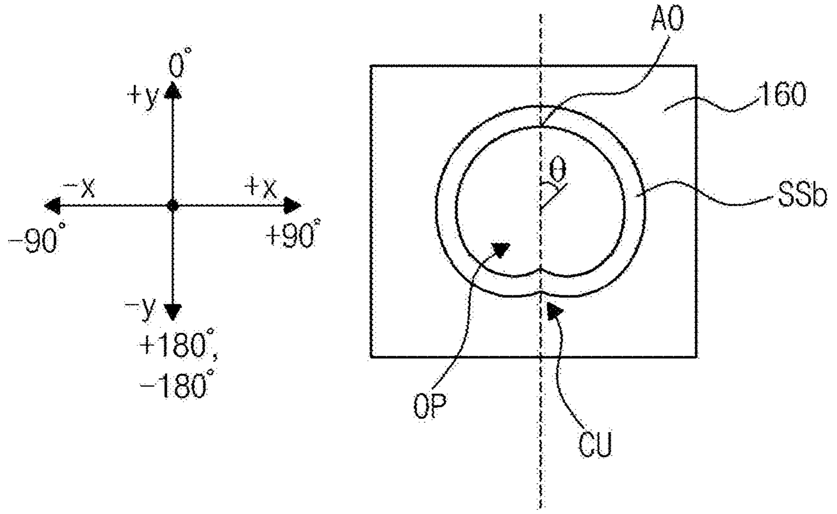
Figure 4:
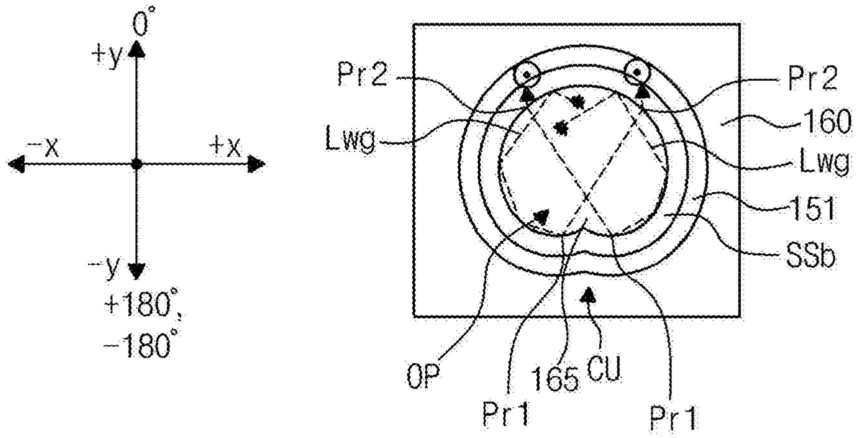

FIG. 1 is a schematic cross-sectional view illustrating a light emitting display device according to a first embodiment of the present disclosure. FIGS. 2 to 4 are plan views schematically illustrating a cardioid-shaped light extraction structure of a pixel region according to a first embodiment of the present disclosure.

Prior to a detailed description, the light emitting display device 10 according to the first embodiment of the present disclosure may include all kinds of display devices including a light emitting diode OD, which is a self-luminescent element, to display an image.

In this embodiment, for convenience of description, an organic light emitting display device is taken as the light emitting display device 10 as an example.

Referring to FIG. 1, the light emitting display device 10 of this embodiment may be a top emission type display device that displays an image by outputting light toward an upper side of a substrate 101.

On the substrate 101 of the light emitting display device 10, a plurality of pixel regions P may be arranged in a matrix form along a plurality of row lines and a plurality of column lines in a display region AA displaying an image. Meanwhile, although not shown in the drawings, a plurality of gate lines extending in a row direction and a plurality of data lines extending in a column direction may be formed on the substrate 101. Each pixel region P may be connected to corresponding gate line and data line.

The plurality of pixel regions P may include pixel regions of different colors constituting a unit pixel displaying a color image, for example, red (R), green (G), and blue (B) pixel regions P respectively displaying red (R), green (G), and blue (B).

In each pixel region P, a plurality of thin film transistors, at least one capacitor, and a light emitting diode OD may be formed on the substrate 101. Meanwhile, in FIG. 1, for convenience of description, one thin film transistor T, for example, a driving thin film transistor T disposed in the red (R) pixel region P is shown.

In more detail, a semiconductor layer 112 may be formed on an inner surface of the substrate 101. In this case, the semiconductor layer 112 may be made of amorphous silicon, polycrystalline silicon, or an oxide semiconductor material, but is not limited thereto.

The semiconductor layer 112 may include a central channel region and source and drain regions on both sides of the channel region.

A gate insulating layer 115 as an insulating layer made of an insulating material may be formed on the semiconductor layer 112. The gate insulating layer 115 may be formed of an inorganic insulating material such as silicon oxide or silicon nitride, but is not limited thereto.

A gate electrode 120 made of a conductive material such as metal may be formed on the gate insulating layer 115 to correspond to the channel region of the semiconductor layer 112.

In addition, a gate line connected to a gate electrode of a switching thin film transistor (not shown) may be formed on the gate insulating layer 115.

A first interlayered insulating layer 125 as an insulating layer made of an insulating material may be formed on the gate electrode 120 and over the entire surface of the substrate 101.

The first interlayered insulating layer 125 may be formed of an inorganic insulating material such as silicon oxide or silicon nitride, or may be formed of an organic insulating material such as benzocyclobutene or photo acryl, but is not limited thereto.

In the first interlayered insulating layer 125 and the gate insulating layer 115 below the first interlayer insulating layer 125, a first contact hole CH1 and a second contact hole CH2 respectively exposing the source region and the drain region of the semiconductor layer 112 may be provided.

The first contact hole CH1 and the second contact hole CH2 may be disposed on both sides of the gate electrode 120 and be spaced apart from the gate electrode 120.

A source electrode 131 and a drain electrode 133 made of a conductive material such as metal may be formed on the first interlayered insulating layer 125.

In addition, on the first interlayer insulating layer 125, a data line that crosses the gate line and is connected to the source electrode of the switching thin film transistor may be formed.

The source electrode 131 and the drain electrode 133 may be spaced apart from each other with the gate electrode 120 therebetween, and may contact the source region and the drain region of the semiconductor layer 112 through the first contact hole CH1 and the second contact hole CH2, respectively.

The semiconductor layer 112, the gate electrode 120, the source electrode 131, and the drain electrode 133, configured as above, may constitute the thin film transistor T.

As another example, the thin film transistor T may have an inverted staggered structure in which the gate electrode 120 is located below the semiconductor layer 112 and the source electrode 131 and the drain electrode 133 are located on the semiconductor layer 112.

A second interlayered insulating layer 135 as an insulating layer made of an insulating material may be formed on the source electrode 131 and the drain electrode 133 and over the entire surface of the substrate 101.

The second interlayered insulating layer 135 may be formed of an inorganic insulating material such as silicon oxide or silicon nitride, but is not limited thereto.

An overcoat layer (or planarization layer) 140 may be formed on the second interlayered insulating layer 135. The overcoat layer 140 may be formed of an organic insulating material such as benzocyclobutene or photo acryl, but is not limited thereto.

A third contact hole (or drain contact hole) CH3 exposing the drain electrode 133 may be formed in the overcoat layer 140 and the second interlayered insulating layer 135.

The overcoat layer 140 may include protruding portions (or separation walls) 141 protruding upward along a boundary (or edge) of each pixel region P. Accordingly, the overcoat layer 140 may be formed with concave grooves GR defined inside the protruding portions 141 by the protruding portions 141. Meanwhile, a portion of the overcoat layer 140 positioned below the concave groove GR (or below a bottom surface of the concave groove GR) may have a top surface (or upper surface) thereof which is substantially flat and be referred to as a flat portion (or base portion) 145.

The protruding portion 141 may be configured to have a tapered shape in which a width thereof narrows in an upward direction which is a light emission direction. Accordingly, the protruding portion 141 may be configured with a side surface SSo thereof as an inclined surface SSo. In this regard, the inclined surface SSo of the protruding portion 141 may be configured to have a shape inclined at a certain angle in an outward direction based on the corresponding pixel region P. The inclined surface SSo may have a linear shape having a constant inclination angle or a protruding curved shape in which the inclination angle decreases from a lower end to an upper end. In this embodiment, a case where the inclined surface SSo is linear is taken as an example.

The inclined surface SSo may surround the concave groove GR to define the concave groove GR. Accordingly, it can be seen that the concave groove GR has an inclined side surface (or outer circumferential surface) corresponding to the inclined surface SSo.

A first electrode (or anode) 150 may be formed on the overcoat layer 140 in each pixel region P.

The first electrode 150 of each pixel region P may be positioned to correspond to each concave groove GR of the overcoat layer 140, and may have a structure separated from the first electrode 150 of a neighboring pixel region P with the protruding portion 141 interposed therebetween. For example, neighboring first electrodes 150 may be spaced apart from each other on the upper surface of the protruding portion 141.

The first electrode 150 may include a metal material with high reflectance. For example, the first electrode 150 may include Al, Ag, Ti, or an Al—Pd—Cu (APC) alloy, but is not limited thereto.

Meanwhile, the first electrode 150 may have a single-layered structure or a multi-layered structure. When formed in a multi-layered structure, for example, the first electrode may have a laminated structure of Al and Ti (e.g., Ti/Al/Ti), a laminated structure of Al and ITO (e.g., ITO/Al/ITO), a laminated structure of an APC alloy and ITO (e.g., ITO/APC/ITO), etc., but is not limited thereto.

The first electrode 150 may include a reflective portion (or inclined portion) 151 formed along the inclined surface SSo of the overcoat layer 140. The reflective portion 151 may have a shape extending obliquely upward along the inclined surface SSo from the end of the portion of the first electrode 150 positioned on the flat portion 145 of the overcoat layer 140. The portion of the first electrode 150 positioned on the flat portion 145 of the overcoat layer 140 may be referred to as a flat portion (or base portion) 152 of the first electrode.

A bank 160 may be formed on the first electrode 150 to cover an edge of the first electrode 150. The bank 160 may be disposed along the boundary of the pixel region P, and may cover the edge portion including the reflective portion 151 of the first electrode 150 and cover the protruding portion 141 of the overcoat layer 140.

The bank 160 may be formed of, for example, at least one of acrylic resin, epoxy resin, phenol resin, polyamide resin, polyimide resin, unsaturated polyester resin, polyphenylene resin, polyphenylene sulfide resin, benzocyclobutene and photoresist, but is not limited thereto.

The bank 160 may have an opening OP therein exposing the first electrode 150 of each pixel region P.

The bank 160 may be formed in substantially the same shape as (or a shape corresponding to) the overcoat layer 140.

In this regard, the bank 160 may be configured to have a tapered shape with a width being narrower in an upward direction. The tapered shape of the bank 160 may be the same as that of the protruding portion 141 of the overcoat layer 140 positioned therebelow.

Accordingly, the bank 160 may be configured such that its side surface is an inclined surface SSb. The inclined surface SSb of the bank 160 may have substantially the same inclination angle as the inclined surface SSo of the protrusion 141 located therebelow.

The inclined surface SSb of the bank 160 may surround the opening OP. Accordingly, it can be seen that the opening OP has an inclined side surface (or outer circumferential surface) corresponding to the inclined surface SSb.

The opening OP may expose the flat portion 152 of the first electrode 150. More specifically, the bank 160 may be configured to cover the edge of the flat portion 152 of the first electrode 150, and the opening OP may expose a portion of the flat portion 152 except for the edge of the flat portion 152.

An emission layer 165 may be formed on the first electrode 150 of each pixel region P. The emission layer 165 may contact the first electrode 150 exposed through the opening OP of the bank 160.

The emission layer 165 may be formed separately in each pixel region P or may be formed continuously along the entire surface of the substrate 101 to correspond to all pixel regions P. In this embodiment, for convenience of explanation, a case in which the emission layer 165 is formed in each pixel region P is taken as an example.

All of the emission layers 165 in respective pixel regions P may be formed of white emission layer emitting white light. As another example, the emission layer 165 of each pixel region P may be formed of an emission layer emitting the color of its pixel region P, for example, red (R), green (G), and blue (B) pixel regions P may respectively have red (R), green (G), and blue (B) emission layers.

A second electrode (or cathode) 169 may be formed on the emission layer 165 and over the entire surface of the substrate 101.

The second electrode 169 may be formed of a transparent electrode having a transparent property, and in this case, the second electrode 169 may be formed of a transparent conductive material such as ITO.

Meanwhile, in a case of realizing a micro cavity effect in a vertical direction, the second electrode 169 may be configured to include a semi-transparent (or semi-transmissive) electrode layer having a semi-transparent property, and may have a multi-layered structure including the semi-transparent electrode layer. The semi-transparent electrode layer of the second electrode 169 may be formed of, but not limited to, for example, a metal material such as magnesium (Mg), silver (Ag), or an alloy (MgAg) of magnesium (Mg) and silver (Ag), and such the metal material may be formed with a thickness thin enough to realize semi-transparent property.

The first electrode 150, the emission layer 165, and the second electrode 169 arranged as described above in the pixel region P may constitute the light emitting diode OD.

The light emitting diode OD may emit light from the emission layer 165 interposed between the first and second electrodes 150 and 169, and the emitted light may proceed upward and be output.

Meanwhile, some of the light generated from the emission layer 165 may propagate while being totally reflected in the lateral direction (or horizontal direction) of the pixel region P and may be trapped inside the display device. The so-called waveguide mode light traveling in the lateral direction may be reflected by the reflective portion 151 of the first electrode 150 disposed in the lateral direction of the light emitting diode OD and then emitted upward. As such, the reflective portion 151 of the first electrode 150 may function as a mirror for reflecting light traveling in a lateral direction upward.

Due to the reflective portion 151 of the first electrode 150, light extraction efficiency of the light emitting display device 10 may be increased.

A region corresponding to the first electrode 150 exposed by the opening OP may be an effective (or substantial) emission region in which the light emitting diode OD is disposed to generate light, and this region may be referred to as a first emission region (or main emission region) EA1. Further, a region where the reflective portion 151 is disposed may be a so-called reflective emission region in which light generated in the emission layer 165 located inside the region and then propagated in the lateral direction is reflected and emitted upward, and this region may be referred to as a second emission region (or sub emission region EA2.

It can be seen that each pixel region P has an emission region including the first emission region EA1 and the second emission region EA2. The first emission region EA1 may substantially correspond to a shape of the region corresponding to the first electrode 150 exposed through the opening OP, and the second emission region EA2 may have a shape that is at least partially spaced from the first emission region EA1 (e.g., the spaced region may be referred to as a first non-emission region) and surrounds the first emission region EA1. However, the second emission region EA2 may have a discontinuous band shape in which a section of a cusp (CU of FIG. 2) of a cardioid-shaped structure is in a black state or in a low luminance state.

An encapsulation layer 180 may be formed on the second electrode 169. The encapsulation layer 180 may serve to prevent oxygen or moisture from permeating into the light emitting diode OD.

The encapsulation layer 180 may include, for example, at least one inorganic layer and at least one organic layer. Although not specifically shown, for example, the encapsulation layer 180 may have a structure in which a first inorganic layer, an organic layer on the first inorganic layer, and a second inorganic film on the organic layer are stacked.

A black matrix BM and a color filter layer 195 may be disposed on the encapsulation layer 180.

In this regard, the black matrix BM may be formed to correspond to an edge of each pixel region P.

The color filter layer 195 may be formed to correspond to each pixel region P. The color filter layer 195 may include red, green, and blue color filters 195*r*. 195*g*, and 195*b* respectively corresponding to the red (R), green (G), and blue (B) pixel regions P.

By disposing the color filters 195*r*, 195*g*, and 195*b* in the corresponding pixel regions P, a color purity of light emitted from the corresponding pixel regions P can be improved.

An overcoat film 199 may be formed on the black matrix BM and the color filter layer 195 to cover and protect them. The substrate having the overcoat film 199 may have a substantially flat surface.

Meanwhile, in the light emitting display device 10 of this as described above, in order to increase or maximize light extraction efficiency, the opening OP (or its inclined surface SSb) of the bank 160 and the reflective portion 151 may be formed in the so-called cardioid-shaped (or heart-shaped) structure.

When the opening OP of the bank 160 is formed in the cardioid-shaped structure, a whispering gallery mode light, which is a waveguide light that is continuously totally reflected along the interface between the emission layer 165 and the bank 160 (or its inclined surface SSb) and thus is not output and is trapped in the emission layer 165, can be extracted and utilized. Accordingly, light extraction efficiency can be increased or maximized.

The light extraction of the cardioid-shaped structure is described in more detail.

Referring to FIGS. 2 and 3 along with FIG. 1, the opening OP (or the inclined surface SSb) of the bank 160 of this embodiment may be formed in the cardioid shape, which is an asymmetric shape, when viewed in plan. Accordingly, the light emitting diode OD located within the opening OP may also be formed to have the cardioid shape.

In addition, the concave groove GR of the overcoat layer 140 (or the inclined surface SSo of the protruding portion 141) and the reflective portion 151 of the first electrode 150 may also be formed in the cardioid shape substantially the same as the bank 160.

In this regard, when the concave groove GR of the overcoat layer 140 is formed in the cardioid shape, the reflective portion 151 formed along the inclined surface SSo defining the concave groove GR may also be formed in the cardioid shape, and the opening OP of the bank 160 covering the reflective portion 151 may also be formed in the cardioid shape.

Moreover, the emission layer 165 (or light emitting diode OD) located in the opening OP of the bank 160 may also have the side surface (or outer circumferential surface) of the cardioid shape.

The cardioid-shaped structure of the above components is described using the cardioid-shaped structure of the bank 160 shown in FIG. 3 as a representative example.

In FIG. 3, for convenience of explanation, a +y direction, which is an upward direction in the drawing, is set to an azimuth angle θ of 0 degrees, and a −y direction, which is a downward direction in the drawing, is set to an azimuth angle θ of +180 degrees or −180 degrees. At this time, it is assumed that based on an azimuth angle θ of 0 degrees, the azimuth angle θ increases to +180 degrees in a clockwise direction (i.e., in a right circumferential direction in the drawing), and the azimuth angle θ decreases to −180 degrees in a counterclockwise direction (i.e., in a left circumferential direction in the drawing) (or an absolute value of the azimuth angle θ increases to 180 degrees in the counter-clockwise direction).

Here, the cardioid-shaped structure of the bank 160 has the cusp CU of a pointed shape toward the inside of the opening OP, and the cusp CU is set to be located at, for example, the azimuth angle of the −y direction, +180 degrees or −180 degrees.

In this case, as the azimuth angle θ increases clockwise from a 0-degree azimuth angle point A0 to the cusp (CU) point (i.e., from 0 degrees to +180 degrees), a curvature increases continuously (or a radius decreases continuously) to form a curved surface shape that is roughly convex to the right. In addition, as the azimuth angle θ decreases counterclockwise from the 0-degree azimuth angle point A0 to the cusp (CU) point (i.e., from 0 degrees to −180 degrees), a curvature increases continuously (or a radius decreases continuously) to form a curved surface shape that is convex to the left.

In other words, based on the cusp CU, a curved surface shape is formed in which a curvature continuously decreases (or a radius continuously increases) from the cusp CU to the portion A0 located opposite to the cusp CU.

The shape (or planar shape) of such the cardioid-shaped structure may be defined according to an equation 1 below.

$$r=r0*(1\pm\varepsilon*\cos(\theta/2)). \quad \text{Equation 1:}$$

The equation 1 is an equation that defines the radius r of the curved surface of the cardioid-shaped structure according to the azimuth angle θ, where r0 is the radius (i.e., the minimum radius) at the cusp CU where the azimuth angle is +180 or −180 degrees, and ε is a deformation parameter.

Accordingly, a rate of change in curvature of the cardioid-shaped structure can be determined by the deformation parameter ε, thereby determining its form. In this regard, for example, as the deformation parameter ε increases, the rate of change in curvature of the cardioid-shaped structure increases, and accordingly, the cusp (CU) portion of the cardioid-shaped structure becomes sharper. As such, as the deformation parameter & increases, an asymmetry of the cardioid-shaped structure increases, so that a distribution range of extracted light through the cardioid-shaped structure can be narrowed, and condensing characteristics of the extracted light can be increased.

The bank 160 may be configured in the above cardioid-shaped structure. In this regard, when viewed in plan, the opening OP (or inclined surface SSb) of the bank 160 may be configured in the cardioid-shaped structure with the curved surface shape which has the cusp CU as a transition point of curvature, and whose curvature decreases along the circumferential direction based on the cusp CU.

Since the bank 160 is formed in the asymmetric cardioid-shaped structure, its width may be differentiated depending on a location. For example, regarding widths that each are a distance from each of points with azimuth angles of 0 degrees, 45 degrees, 90 degrees, and 120 degrees to each of points on opposite sides, the width at the point with the azimuth angle of 0 degrees is the smallest one (e.g., 2.50 um), the width at the point with the azimuth angle of 45 degrees is next one (e.g., 2.65 um), the width at the point with the azimuth angle of 120 degrees is next one (e.g., 2.68 um), and the width at the point with the azimuth angle of 90 degrees is the largest one (e.g., 2.71 um). As such, by being formed in the cardioid-shaped structure, the bank 160 can be differentiated in width by location (or by azimuth).

Meanwhile, like the cardioid-shaped structure of the bank 160, the concave groove GR (or the inclined surface SSo) of the overcoat layer 140 and the reflective portion 151 of the first electrode 150 may also be configured in the cardioid-shaped structure with the cusp CU.

As described above, by forming the bank 160 in the asymmetric cardioid-shaped structure, due to its morphological characteristics, the waveguide light that is totally reflected along the interface between the bank 160 and the emission layer 165 can be easily extracted.

This is described with reference to FIG. 4. FIG. 4 is a view schematically illustrating a waveguide light extraction mechanism using a cardioid-shaped structure according to a first embodiment of the present disclosure.

Referring to FIG. 4, some light Lwg of light generated in the emission layer 165 and traveling in the horizontal direction is incident on the interface between the emission layer 165 and the bank 160 at an angle greater than a total reflection critical angle and may be guided along the interface.

However, according to this embodiment, since the bank 160 is formed in the cardioid-shaped structure, the curvature of the interface between the bank 160 and the emission layer 165 increases toward the cusp CU.

Due to the morphological characteristics of this cardioid-shaped structure, the light Lwg guided along the interface may drastically change its path near (or around) the pointed-shaped cusp CU. In this regard, the light Lwg is reflected near the cusp CU with a large curvature and then proceeds to a point Pr2 substantially opposite to the reflection point Pr1, that is, the point Pr2 located in front of the cusp CU.

As such, the waveguide light Lwg incident on the point Pr2 in front of the cusp CU may have an incident angle smaller than the total reflection critical angle due to the sudden path change.

Accordingly, the waveguide light Lwg can pass through (i.e., pass through while being refracted) the interface of the point Pr2 in front of the cusp CU.

The waveguide light Lwg extracted through the interface in this way is reflected by the inclined reflective portion 151 located in its proceeding direction, and then travels toward a top of the light emitting display device 10, and thus can be output to the outside.

As above, since the cardioid-shaped structure has the cusp CU which is a curvature transition point, it has chaotic characteristics that rapidly change the optical path. Accordingly, most of the waveguide light Lwg rotating along the interface is reflected near the cusp CU and its path is suddenly changed, so that the incident angle becomes less than the total reflection critical angle and can pass through the interface. The light Lwg extracted in this way is reflected by the reflective portion 151 placed in the direction in which it proceeds, and can finally be emitted toward the top of the light emitting display device 10.

As such, by forming the bank 160 in the cardioid-shaped structure with the chaotic characteristics for the optical path, the path of the waveguide light Lwg in the emission layer 165 is chaotic and can be suddenly changed, so that the light extraction efficiency can be increased or maximized.

Moreover, as the light extraction efficiency of the light emitting display device 10 is increased or maximized, power consumption can be reduced compared to the related art light emitting display devices in realizing the same optical characteristics, and as a result, it can be driven with low power.

Meanwhile, the cardioid-shaped structure can also implement resonance characteristics for the waveguide light Lwg. For example, when the path of the waveguide light Lwg, which rotates while being totally reflected along the interface, is set to match a color wavelength band of each pixel region P, the waveguide light Lwg can resonate i.e., can be constructively interfered, in the matched wavelength band. Accordingly, a micro cavity effect can be implemented even for light traveling in the horizontal direction on the substrate, and color reproduction rate can be improved.

Figure 5:
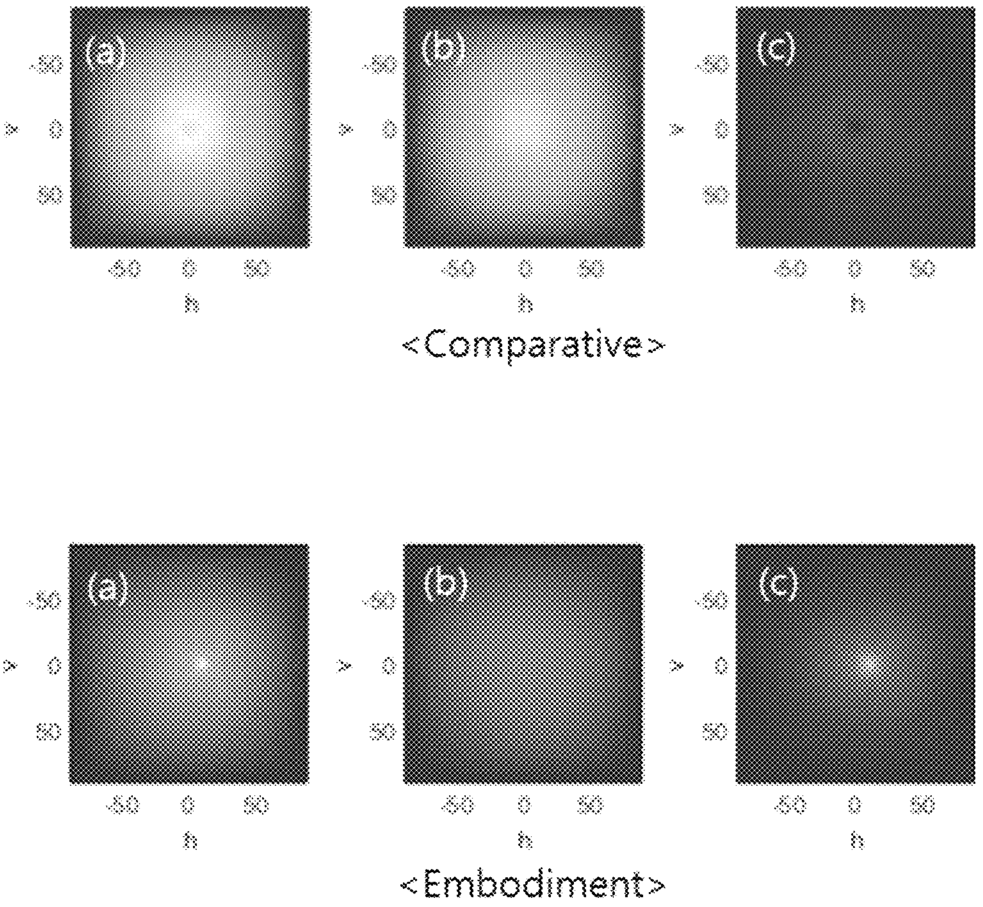
FIGS. 5 and 6 are views illustrating light extraction simulation results for a circular structure of a comparative example and a cardioid-shaped structure of a first embodiment of the present disclosure.
Figure 6:
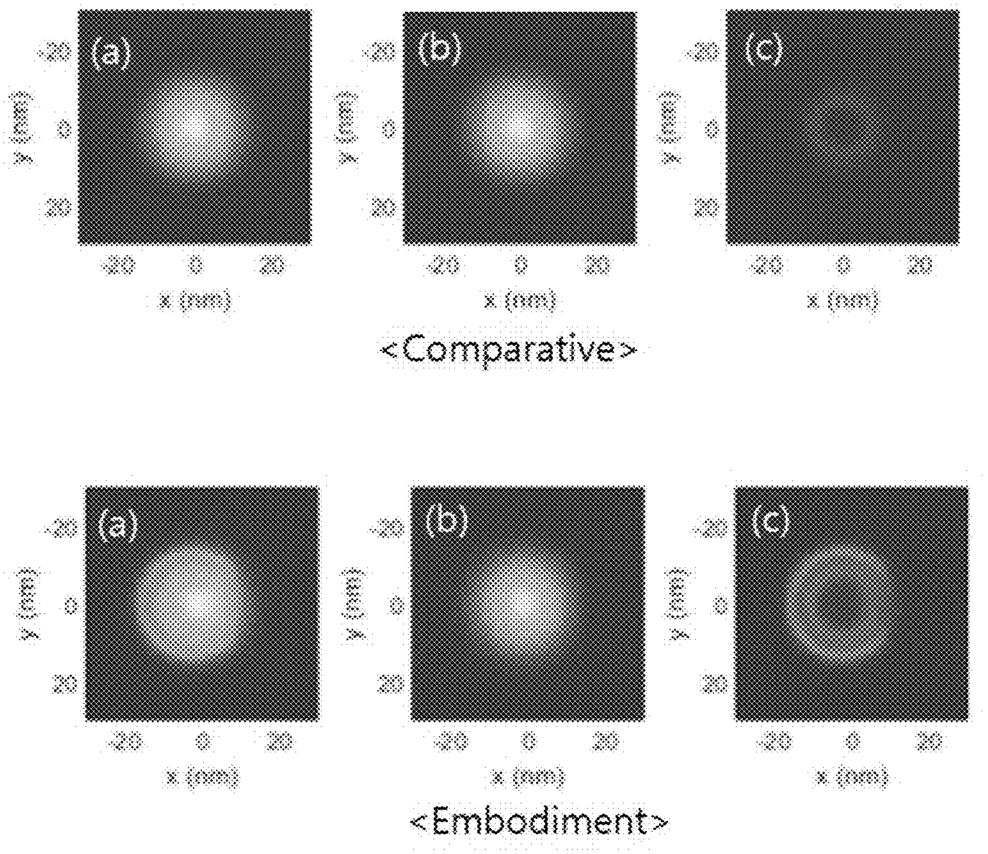

FIGS. 5 and 6 are views illustrating light extraction simulation results for a circular structure of a comparative example and a cardioid-shaped structure of a first embodiment of the present disclosure. FIG. 5 shows the light extraction simulation results in a far field for the circular structure of the comparative example and the cardioid-shaped structure of this embodiment, and FIG. 6 shows the light extraction simulation results in a near field for the circular structure of the comparative example and the cardioid-shaped structure of this embodiment.

In FIGS. 5 and 6, (a) shows an output profile of light including waveguide light, (b) shows an output profile of light excluding waveguide light, and (c) shows an output profile of waveguide light obtained by (a)-(b).

Looking at the far-field output characteristics of FIG. 5, it can be seen that in the comparative example, almost no waveguide light is output, as shown in (c). As such, in the case of the circular structure, most of the waveguide light is not extracted to the outside but is trapped inside and is extinguished.

On the other hand, it can been seen that in this embodiment, a significant amount of waveguide light is output to the outside, as shown in (c). As such, by the configuration of the cardioid-shaped structure, due to its chaotic characteristics, the waveguide light can be effectively extracted.

Looking at the near-field light output characteristics of FIG. 6, it can be seen that in the comparative example, waveguide light is output at a very small level, as shown in (c). As such, in the case of the circular structure, most of the waveguide light is not extracted to the outside but is trapped inside and is extinguished.

On the other hand, it can be seen that in this embodiment, a significant amount of waveguide light is output to the outside, as shown in (c). As such, by the configuration of the cardioid-shaped structure, due to its chaotic characteristics, the waveguide light can be effectively extracted.

Second Embodiment

Figure 7:
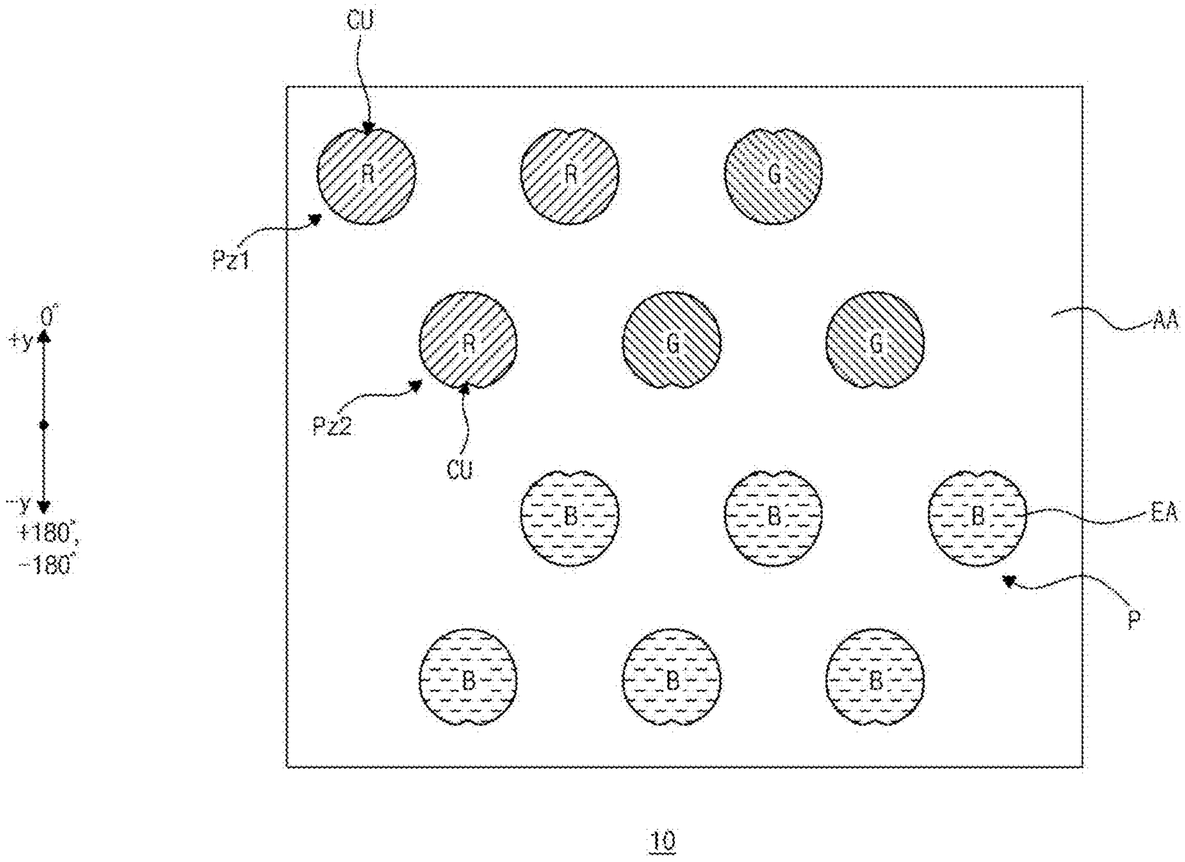
FIG. 7 is a plan view schematically illustrating an arrangement structure of pixel regions in a display region of a light emitting display device according to a second embodiment of the present disclosure.

FIG. 7 is a plan view schematically illustrating an arrangement structure of pixel regions in a display region of a light emitting display device according to a second embodiment of the present disclosure.

In the following description, detailed explanations of components identical or similar to those of the first embodiment described above may be omitted.

In FIG. 7, for convenience of description, the pixel regions P disposed in a portion of the display region AA of the light emitting display device 10 is shown. The emission region EA of the pixel region P is briefly shown in the cardioid-shaped structure.

Regarding the cardioid-shaped structure of the pixel region P of this embodiment, reference may be made to the above-described first embodiment.

Referring to FIG. 7, in the light emitting display device 10 of this embodiment, the plurality of pixel regions P may be arranged in the display region AA.

Meanwhile, the plurality of pixel regions P may include pixel regions P of different colors, for example, red (R), green (G), and blue (B) pixel regions P. In this embodiment, for convenience of explanation, a case where three red (R) pixel regions P and three green (G) pixel regions P are arranged in first and second rows, and six blue (B) pixel regions P are arranged in third and fourth rows is taken as an example. A number and location of red (R), green (G), and blue (B) pixel regions P may be different from those in FIG. 7.

In the light emitting display device 10 of this embodiment, in order to enhance a front emission (or front output) characteristics, pixel regions P with opposite orientations of the cardioid-shaped structure, for example, first azimuth (or first orientation) pixel regions Pz1 and second azimuth (or second orientation) pixel regions Pz2 may be used together.

For example, in the first azimuth pixel region Pz1, its cusp CU may be located at a first azimuth angle, for example, 0 degrees of the +y direction. And, in the second azimuth pixel region Pz2, its cusp CU may be located at a second azimuth angle, for example, 180 degrees (or −180 degrees) of the −y direction.

The first and second azimuth pixel regions Pz1 and Pz2 may be applied to each of the red (R), green (G), and blue (B) pixel regions P.

For example, regarding the red (R) pixel regions P, the first azimuth pixel region Pz1 of the red (R) may be arranged in the first row, and the second azimuth pixel region Pz2 of the red (R) may be arranged in the second row. Regarding the green (G) pixel regions P, the first azimuth pixel region Pz1 of the green (G) may be arranged in the first row, and the second azimuth pixel region Pz2 of the green (G) may be arranged in the second row. Regarding the blue (B) pixel regions P, the first azimuth pixel region Pz1 of the blue (B) may be arranged in the third row, and the second azimuth pixel region Pz2 of the blue (B) may be arranged in the fourth row.

In this way, for the pixel regions P of each color, the first and second azimuth pixel regions Pz1 and Pz2 may be alternately arranged along one direction (e.g., along the column direction).

Each of the first and second azimuth pixel regions Pz1 and Pz2 may be uniformly distributed within the display region AA, and a number of first azimuth pixel regions Pz1 and a number of second orientation pixel regions Pz2 may be substantially the same.

As such, by using a combination of the first and second azimuth pixel regions Pz1 and Pz2 in which the cardioid-shaped structures are arranged in opposite orientation directions, front emission characteristics can be enhanced.

Figure 8:
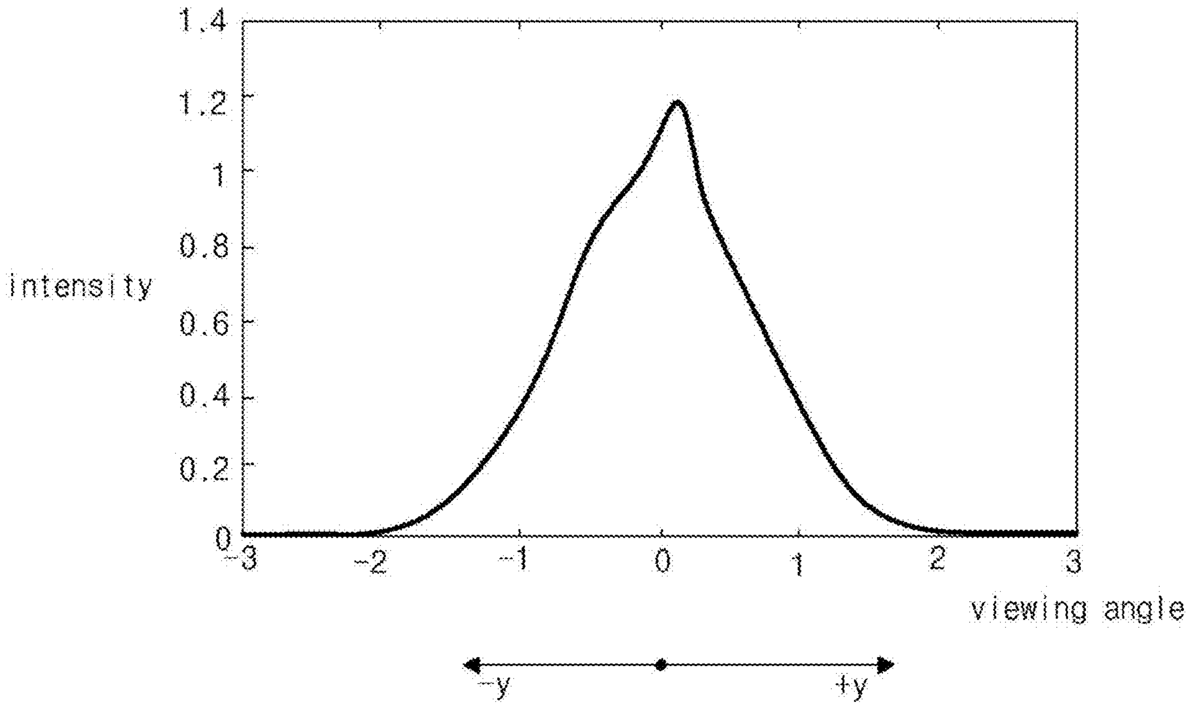
FIG. 8 is a view illustrating a distribution of light output of a pixel region with a cardioid-shaped structure according to a second embodiment of the present disclosure.

This is explained with reference to FIG. 8. FIG. 8 is a view illustrating a distribution of light output of a pixel region with a cardioid-shaped structure according to a second embodiment of the present disclosure. The distribution of light output in FIG. 8 is a distribution when a deformation parameter is 0.5, and a reflective portion has a straight line shape with an inclination angle of 45 degrees.

In FIG. 8, for convenience of explanation, a distribution of light output of the second azimuth pixel region Pz2 is shown. A distribution of light output of the first azimuth pixel region Pz1 has a left-right opposite form to FIG. 8.

Referring to FIG. 8, due to the asymmetry of the cardioid-shaped structure, for the light output from the second azimuth pixel region Pz2, a light output curve has an asymmetrical shape with a slight bias from a front perpendicular to a substrate surface (i.e., a viewing angle of 0 degrees in FIG. 8) toward a direction which the corresponding cusp CU faces (i.e., +y direction in FIG. 7). Accordingly, if only the second azimuth pixel regions Pz2 are disposed in the entire display region AA, emission is strengthened in an oblique viewing angle direction biased from the front to one side (i.e., upper side), and relatively, emission at the front viewing angle is somewhat reduced.

However, as in this embodiment, when the first and second azimuth pixel regions Pz1 and Pz2 with opposite orientations of the cardioid-shaped structure are arranged together, emission enhancement direction can be corrected to the front.

In other words, since the first azimuth pixel region Pz1 has the cardioid-shaped structure opposite in orientation to that of the second azimuth pixel region Pz2, the light output characteristics of the first azimuth pixel region Pz1 is also opposite to that of the second azimuth pixel region Pz2.

Accordingly, when the first azimuth pixel region Pz1 is arranged together with the second azimuth pixel region Pz2, as a result, the opposite asymmetric light output characteristics (or asymmetric viewing angle characteristics) are averaged so that the light output distribution can have a substantially symmetrical form based on the front direction. As a result, the emission characteristics can be strengthened in the front viewing angle direction.

As described above, according to the embodiments of the present disclosure, by configuring the pixel region in the cardioid-shaped structure with the chaotic characteristics for the optical path, the path of the horizontal waveguide light can be chaotic and rapidly changed, thereby increasing or maximizing the light extraction efficiency of the light emitting display device.

In addition, by arranging the pixel regions with the cardioid-shaped structures opposite in orientation in the display region together, the emission characteristics can be enhanced in the front viewing angle direction of the light emitting display device.

Moreover, as described above, as the light efficiency of the light emitting display device according to the embodiments of the present disclosure is improved, power consumption can be reduced, and the light emitting display device can be driven with low power.

It will be apparent to those skilled in the art that various modifications and variation can be made in the present disclosure without departing from the spirit or scope of the disclosure. Thus, it is intended that the present disclosure cover the modifications and variations of this disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light emitting display device, comprising:

a bank that is on a substrate and includes an opening corresponding to each of a plurality of pixel regions of a display region;

an inclined reflective portion that is below the bank and disposed in each of the plurality of pixel regions; and a light emitting diode disposed in the opening, wherein each of the plurality of pixel regions is configured such that the corresponding opening and reflective portion have a cardioid-shaped structure with a cusp, and wherein the plurality of pixel regions includes a pixel region in which the cardioid-shaped structure is located in a first azimuth, and a pixel region in which the cardioid-shaped structure is located in a second azimuth opposite to the first azimuth.

2. The light emitting display device of claim 1, wherein within the display region, a number of the pixel region in the first azimuth and a number of the pixel region in the second azimuth are the same.

3. The light emitting display device of claim 1, wherein the pixel region in the first azimuth and the pixel region in the second azimuth are arranged alternately along one direction.

4. The light emitting display device of claim 1, wherein the plurality of pixel regions includes red, green, and blue pixel regions, and wherein the red, green, and blue pixel regions each include the pixel region in the first azimuth and the pixel region in the second azimuth.

5. The light emitting display device of claim 1, wherein the cardioid-shaped structure is defined as $r=r0*(1+\varepsilon*\cos(\theta/2))$, where $\theta$ is an azimuth angle, r0 is a radius at the cusp, r is a radius at $\theta$, and $\varepsilon$ is a deformation parameter.

6. The light emitting display device of claim 1, wherein the cardioid-shaped structure of the opening is configured to implement resonance for light in a horizontal direction of the corresponding pixel region.

7. The light emitting display device of claim 1, wherein the light emitting diode includes a first electrode, an emission layer on the first electrode, and a second electrode on the emission layer, and wherein the reflective portion extends from the first electrode.

8. A light emitting display device, comprising:

a light emitting diode that is in each of a plurality of pixel regions arranged in a display region on a substrate, and includes an emission layer forming an interface of a cardioid-shaped structure with a side surface of a bank; and an inclined reflective portion that is below the bank and disposed outside the interface, wherein the plurality of pixel regions includes a pixel region in which the cardioid-shaped structure is located in a first azimuth, and a pixel region in which the cardioid-shaped structure is located in a second azimuth opposite to the first azimuth, and wherein the reflective portion has the same cardioid-shaped structure as the interface of the corresponding pixel region.

9. The light emitting display device of claim 8, wherein within the display region, a number of the pixel region in the first azimuth and a number of the pixel region in the second azimuth are the same.

10. The light emitting display device of claim 8, wherein the pixel region in the first azimuth and the pixel region in the second azimuth are arranged alternately along one direction.

11. The light emitting display device of claim 8, wherein the plurality of pixel regions includes red, green, and blue pixel regions, and wherein the red, green, and blue pixel regions each include the pixel region in the first azimuth and the pixel region in the second azimuth.

12. The light emitting display device of claim 8, wherein the cardioid-shaped structure is defined as $r=r0*(1+\varepsilon*\cos(\theta/2))$, where $\theta$ is an azimuth angle, r0 is a radius at a cusp of the cardioid-shaped structure, r is a radius at $\theta$, and $\varepsilon$ is a deformation parameter.

13. The light emitting display device of claim 8, wherein the cardioid-shaped structure of the interface is configured to implement resonance for light in a horizontal direction of the corresponding pixel region.

14. The light emitting display device of claim 8, wherein the light emitting diode includes a first electrode and a second electrode respectively disposed below and on the emission layer, and wherein the reflective portion extends from the first electrode.

15. A light emitting display device, comprising:

an overcoat layer that is on a substrate and includes a concave groove corresponding to at least one pixel region;

a first electrode including a reflective portion disposed along an inclined surface of the concave groove;

a bank disposed on the first electrode and including an opening; and an organic emission layer and a second electrode disposed in the opening, wherein at least two of the concave groove, the reflective portion, and the opening are configured in a cardioid-shaped structure with a cusp.

16. The light emitting display device of claim 15, wherein the at least one pixel region includes a first emission region corresponding to the opening, and a second emission region corresponding to the reflective portion and surrounding the first emission region, and wherein the second emission region is in a black state or in a low luminance state at a section of the cusp to be discontinuous.

17. The light emitting display device of claim 8, wherein the bank includes an opening corresponding to each of the plurality of pixel regions, and wherein the opening has the same cardioid-shaped structure as the interface of the corresponding pixel region.

* * * * *